United States Patent
Lai et al.

(10) Patent No.: US 8,279,097 B2
(45) Date of Patent: Oct. 2, 2012

(54) BACKGROUND CALIBRATION OF ANALOG-TO-DIGITAL CONVERTERS

(75) Inventors: Fang-Shi Jordan Lai, Chia Yi (TW); Kuo-Ming Wang, Hsin-Chu (TW); Hsu-Feng Hsueh, Tainan (TW); Cheng Yen Weng, Hsin-Chu (TW); Yung-Fu Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 149 days.

(21) Appl. No.: 12/775,104

(22) Filed: May 6, 2010

(65) Prior Publication Data

US 2011/0012763 A1 Jan. 20, 2011

Related U.S. Application Data

(60) Provisional application No. 61/226,187, filed on Jul. 16, 2009.

(51) Int. Cl.
*H03M 1/10* (2006.01)
(52) U.S. Cl. ......... 341/120; 341/117; 341/155; 341/172
(58) Field of Classification Search .......... 341/117–120, 341/155, 161, 172
See application file for complete search history.

(56) References Cited

U.S. PATENT DOCUMENTS

| | | | | |
|---|---|---|---|---|
| 5,574,457 | A * | 11/1996 | Garrity et al. | 341/172 |
| 5,929,796 | A * | 7/1999 | Opris et al. | 341/120 |
| 6,756,929 | B1 * | 6/2004 | Ali | 341/161 |
| 6,822,601 | B1 * | 11/2004 | Liu et al. | 341/161 |
| 7,304,598 | B1 * | 12/2007 | Bogner | 341/161 |
| 2007/0285298 | A1* | 12/2007 | Easwaran et al. | 341/155 |
| 2008/0129575 | A1* | 6/2008 | Huang | 341/172 |

* cited by examiner

*Primary Examiner* — Jean B Jeanglaude
(74) *Attorney, Agent, or Firm* — Slater & Matsil, L.L.P.

(57) ABSTRACT

A method of operating an analog-to-digital converter (ADC) includes providing the ADC including a plurality of stages, each including an operational amplifier, and a first capacitor and a second capacitor including a first input end and a second input end, respectively. Each of the first capacitor and the second capacitor includes an additional end connected to a same input of the operational amplifier. The method further includes performing a plurality of signal conversions. Each of the signal conversions includes, in an amplifying phase of one of the plurality of stages, applying a first voltage to the first input end of the one of the plurality of stages, randomly selecting a second voltage from two different voltages; and applying the second voltage to the second input end of the one of the plurality of stages.

17 Claims, 5 Drawing Sheets

US 8,279,097 B2

BACKGROUND CALIBRATION OF ANALOG-TO-DIGITAL CONVERTERS

This application claims the benefit of U.S. Provisional Application No. 61/226,187 filed on Jul. 16, 2009, entitled "Background Calibration of Analog-to-Digital Converters," which application is hereby incorporated herein by reference.

TECHNICAL FIELD

This invention relates generally to analog to digital converters (ADCs) and more particularly to the calibration of ADCs.

BACKGROUND

Data converters, both digital-to-analog converters (DACs) and analog-to-digital converters (ADCs), are ubiquitous in applications involving digital signal processing of real-world signals, such as those found in communication systems, instrumentation, and audio and video processing systems.

As the ADCs may have errors, and the operation of the ADCs may drift with time, calibration is needed. Conventionally, the calibration of the ADCs is performed using more accurate ADCs, which are typically slower than the ADCs to be calibrated. To achieve an accurate calibration, the input signal should be high enough to fully calibrate all stages of the ADCs. However, even with the more accurate ADCs and high input signals, non-linear errors may not be able to be fixed through the conventional calibrations.

For example, FIG. 1 illustrates the residue transfer curve of a 1.5 B pipeline ADC, wherein the x-axis $A_j$ represents the input signal of a stage of the ADC, while the y-axis $A_{j+1}$ represents the output signal of the stage. The stage represented by the residue transfer curve has an amplifying rate of 2, which means that the output signal is amplified to twice the residue voltage of input signal $A_j$. FIG. 2 illustrates an ideal case of the digital output code of the output signal $A_{j+1}$. It is noted that the digital output code $D_o$ is linear relative to the input signal $A_j$.

FIG. 3 illustrates a non-ideal residue transfer curve, in which the amplifying rate of a respective stage is deviated from 2. As a result of the deviation of the amplifying rate, the digital output code becomes non-linear, as shown in FIG. 4, in which gaps appear between different portions of the output. The output of the respective ADC thus becomes non-linear. Such problem cannot be solved by conventional ADC calibration regardless how accurate the calibration ADCs are. What is needed, therefore, is a method and structure for overcoming the above-described shortcomings in the prior art.

SUMMARY OF THE INVENTION

In accordance with one aspect of the present invention, a method of operating an analog to digital converter (ADC) includes providing the ADC including a plurality of stages, each including an operational amplifier, and a first capacitor and a second capacitor including a first input end and a second input end, respectively. Each of the first capacitor and the second capacitor includes an additional end connected to a same input of the operational amplifier. The method further includes performing a plurality of signal conversions. Each of the signal conversions includes, in an amplifying phase of one of the plurality of stages, applying a first voltage to the first input end of the one of the plurality of stages, randomly selecting a second voltage from two different voltages; and applying the second voltage to the second input end of the one of the plurality of stages.

Other embodiments are also disclosed.

Features of the present invention include background calibration without interrupting the normal operation of ADCs and the feasibility of solving non-lineal problems. In addition, the calibration of ADCs does not require additional analog devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

A structure of a novel analog to digital converter (ADC) and the method of operating the same are presented. The variations of the embodiment are also discussed. Throughout the various views and illustrative embodiments of the present invention, like reference numbers are used to designate like elements.

Figure 1:
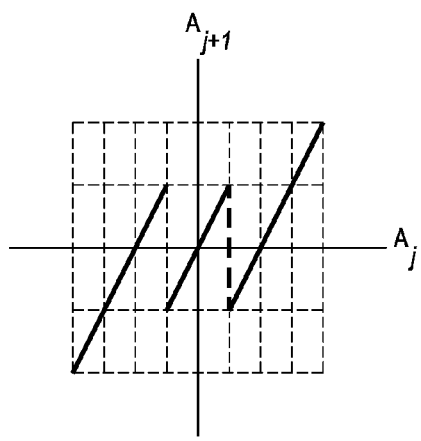
FIG. 1 illustrates a residue transfer curve of a conventional 1.5B pipeline analog to digital converter (ADC)
Figure 2:
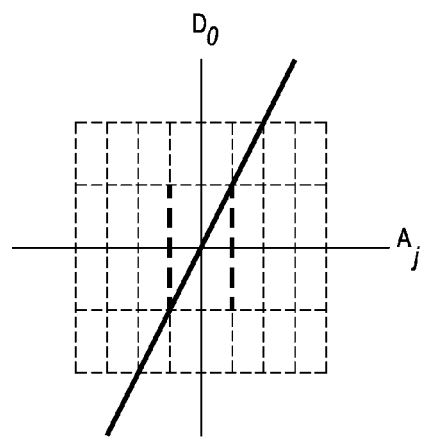
FIG. 2 illustrates the digital output code of the conventional 1.5B pipeline ADC.
Figure 3:
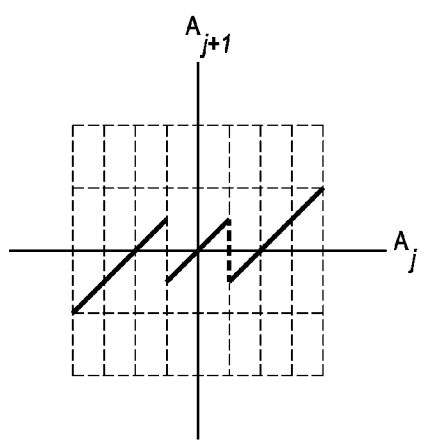
FIG. 3 illustrates a residue transfer curve of a conventional 1.5B pipeline ADC having non-linear errors.
Figure 4:
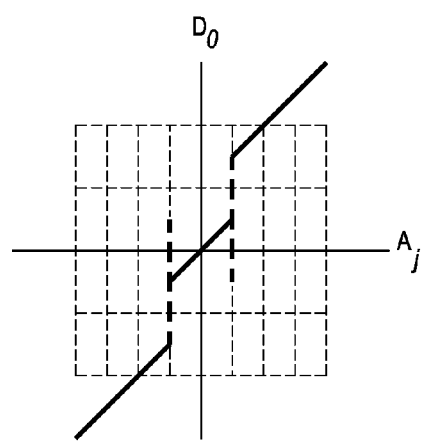
FIG. 4 illustrates the digital output code of the conventional 1.5B pipeline ADC having the non-linear errors.
Figure 5A:
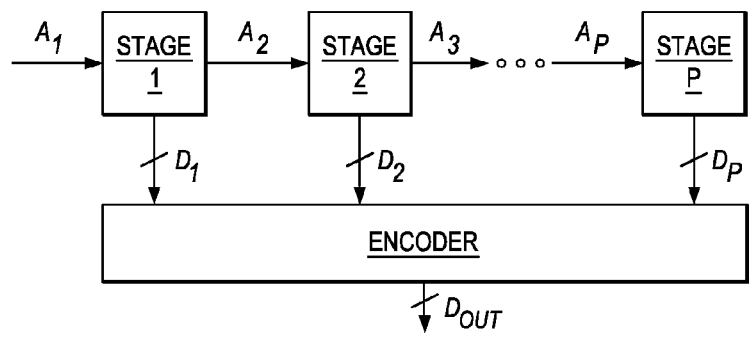
FIG. 5A illustrates a schematic block diagram of an ADC in accordance with an embodiment.

FIG. 5A illustrates a schematic block diagram of an ADC, which may be a pipeline ADC, in accordance with an embodiment. The ADC includes a plurality of stages, namely stage 1, stage 2 . . . and stage P. Each of the stages outputs a digital code (for example, 1 or 0 if the stage decodes only one bit), namely $D_1, D_2 \ldots$ and $D_p$. The digital codes generated by each of the stages may also include more than one bit. Digital code $D_1$ corresponds to the most significant bit (MSB) of the resulting complete digital code of the whole ADC, while digital code $D_p$ corresponds to the least significant bit (LSB) of the resulting complete digital code of the whole ADC. The output of each of the stages on the left is connected to the input of the next stage (a stage on the right). The output signals are denoted as $A_2$ through $A_p$. Signal $A_1$ is the input signal of the ADC.

Figure 5B:
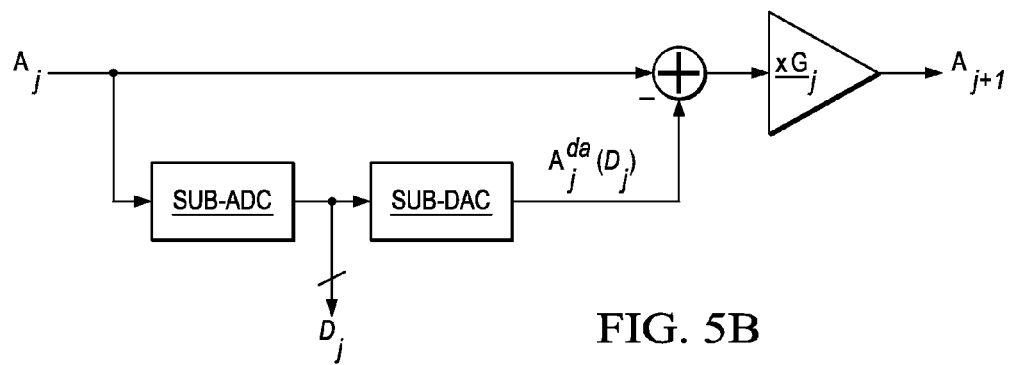
FIG. 5B illustrates the block diagram of one stage of the ADC as shown in FIG. 5A.

FIG. 5B illustrates a schematic block diagram of stage j, which may be any of the stages shown in FIG. 5A. The input signal/voltage of the stage is illustrated as $A_j$, and the output signal/voltage is shown as $A_{j+1}$, wherein j is an integer greater than or equal to 1. The sub-ADC generates the digital code for stage j. The sub-DAC decides whether a voltage (referred to as reference voltage $V_r$ hereinafter) needs to be added or subtracted, and adds reference voltage $V_r$ onto, or subtracts reference voltage $V_r$ from, input voltage $V_j$ (illustrated as input $A_j$ in the figure). The resulting added or subtracted voltage ($A_j^{da}$ ($D_j$)), referred to as a residue voltage hereinafter) is sent to amplifier AMP, and is amplified by an operational amplifier AMP. The amplified signal $A_{j+1}$ is the output of stage j.

Figure 6:
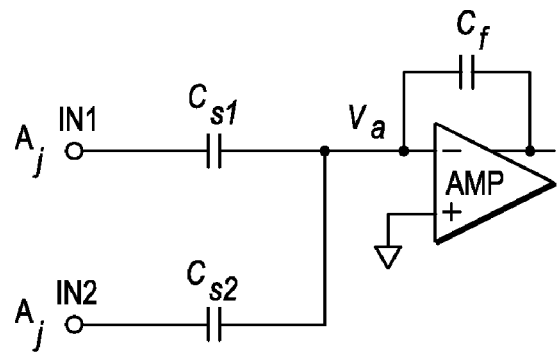
FIG. 6 illustrates a portion of a circuit diagram of a stage of an ADC in a sampling phase.

FIG. 6 illustrates an exemplary circuit diagram of a portion of one of the stages as shown in FIG. 5A. Two sampling capacitors $C_{s1}$ and $C_{s2}$ have a common end connected to one of the inputs of amplifier AMP. Forward capacitor Cf may amplify the signal sampled on sampling capacitors $C_{s1}$ and $C_{s2}$. In an embodiment, sampling capacitors $C_{s1}$ and $C_{s2}$ have the same capacitance. Further, forward capacitor $C_f$ may have a capacitance equal to the capacitance of each of sampling capacitors $C_{s1}$ and $C_{s2}$, although different capacitances are also usable.

Figure 7:
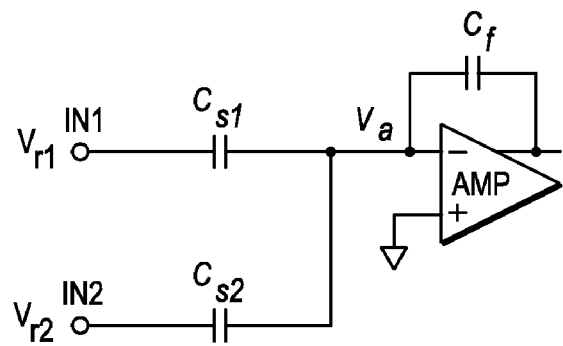
FIGS. 7 and 8 illustrate voltages applied to the circuit shown in FIG. 6 in amplifying phases.

In a sampling phase of the stage, both capacitors $C_{s1}$ and $C_{s2}$ are fed with the input signal $A_j$ at input ends of nodes IN1 and IN2, respectively. Input signal $A_j$ may be the output signal of the preceding stage j−1 (not shown). Next, in the amplifying phase, as shown in FIG. 7, input nodes IN1 and IN2 may be connected to a same or different voltages. Table 1 illustrates exemplary voltages $V_{r1}$ and $V_{r2}$, wherein voltage $V_{r1}$ is applied to input node IN1, and voltage $V_{r2}$ is applied to input node IN2, as shown in FIG. 7. The resulting residue transfer curve is shown in FIG. 9.

TABLE 1

| | A | B | C | D | E | F |
|---|---|---|---|---|---|---|
| $V_{r1}$ | $-V_r$ | $-V_r$ | 0 | 0 | $V_r$ | $V_r$ |
| $V_{r2}$ (q = 1) | $-V_r$ (TC1) | $-V_r$ (TC2) | $-V_r$ (TC4) | 0 (TC6) | $V_r$ (TC8) | $V_r$ (TC10) |
| $V_{r2}$ (q = 0) | $-V_r$ (TC1) | 0 (TC3) | 0 (TC5) | $V_r$ (TC7) | $V_r$ (TC9) | $V_r$ (TC1) |

Figure 9:
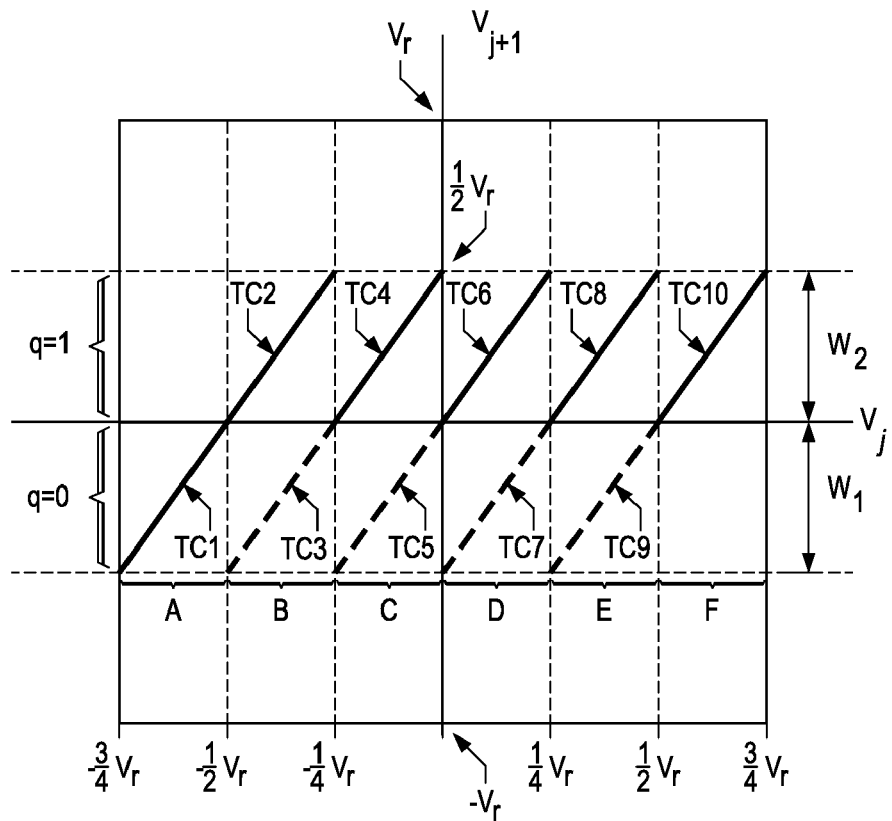
FIG. 9 illustrates a residue transfer curve of a stage of the ADC.

Columns A, B, C, D, E, and F in Table 1 correspond to the regions A, B, C, D, E, and F in FIG. 9, respectively, wherein the regions are divided according to the range of input voltage $A_j$ (refer to FIGS. 5A and 5B). Each column in Table 1 shows that one voltage $V_{r1}$ may be applied to input IN1 in FIG. 6, while there are two options to select voltage $V_{r2}$, which is applied to input IN2. Voltages $V_{r1}$ and $V_{r2}$ are functions of input signal $A_j$, which means that the values of voltages $V_{r1}$ and $V_{r2}$ depend on the value of input signal $A_j$. In an embodiment, in each of the regions A through F, voltage $V_{r2}$ is randomly selected from two possible values, and each of the possible values of $V_{r2}$ corresponds to a random one of two status, namely q=1 and q=0. It is noted that with the randomly selected voltage $V_{r2}$, voltage $V_{r2}$ will unlikely to follow patterns of input signal $A_j$ accidentally. In alternative embodiments, voltage $V_{r2}$ is pseudo randomly selected, which means that its value is pre-determined in a random way, but may be repeated.

Examples are discussed as follows to explain Table 1 and FIG. 9A. The first column in Table 1 shows that if input voltage $A_j$ is less than $-\frac{1}{2}V_r$ and falls into region A in FIG. 9, then voltage $V_{r1}$ is equal to $-V_r$ (wherein $V_r$ represents a reference voltage). In this state, regardless of whether the random status is q=1 or q=0, voltage $V_{r2}$ will also be $-V_r$. Applying $-V_r$ to both inputs IN1 and IN2 is equivalent to adding reference voltage $V_r$ to input signal $A_j$. Column 1 of Table 1 also shows that the respective section in the residue transfer curve is TC1.

The second column shows that if input voltage signal $A_j$ is between $-\frac{1}{4}V_r$ and $-\frac{1}{2}V_r$ and falls into region B in FIG. 9, then voltage $V_{r1}$ is equal to $-V_r$. Voltage $V_{r2}$ is a function of input voltage signal $A_j$. At this time, the status q is randomly generated. If status q is 1, referring to Table 1, input voltage $V_{r2}$ equals $-V_r$, the respective section in the residue transfer curve (FIG. 9) is TC2. If status q is 0, referring to Table 1, input voltage $V_{r2}$ equals 0V, the respective section in the residue transfer curve (FIG. 9) is TC3. Applying $-V_r$ to input node IN1 and 0V to input node IN2 is equivalent to adding voltage $\frac{1}{2}V_r$ to input signal $A_j$. Further, if both input nodes IN1 and IN2 are applied with $V_r$, it is equivalent to subtracting voltage $V_r$ from input signal $A_j$. It is noted that since status q is random, even if the input signal $A_j$ has the same value in two signal conversions (a first signal conversion and a second signal conversion), voltage $V_{r2}$ for the first signal conversion may still be different from the voltage $V_{r2}$ for the second signal conversion.

Figure 10:
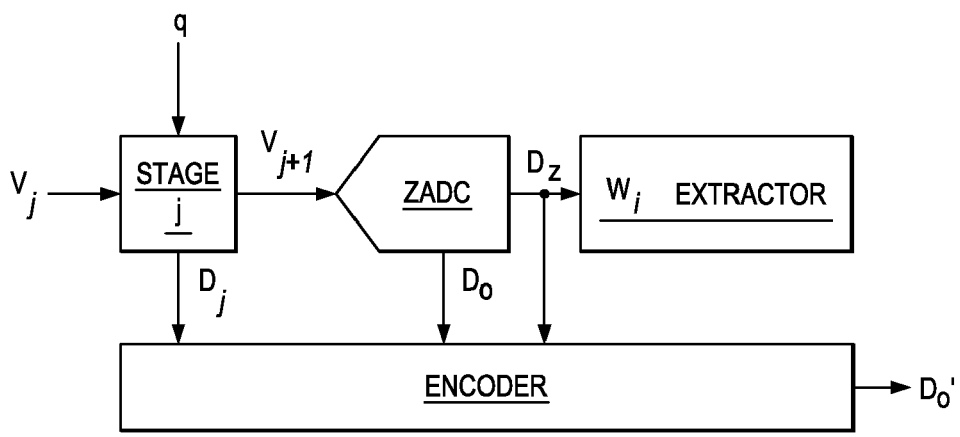
FIG. 10 illustrates a block diagram illustrating how calibration is performed.

The residue voltage (after voltages $V_{r1}$ and $V_{r2}$ are applied) is amplified by operation amplifier AMP, and the output signal $A_{j+1}$ are converted to digital output code $D_o$ by stages following the existing stage j (FIG. 10). The conversion of each input signal $A_j$ generates one digital output code $D_o$. In an embodiment, the above-discussed steps are repeated for converting each of the signals. When multiple conversions of multiple signals are performed, it is expected in about one-half of the conversions, the random status q will be 1, while in about one-half of the conversions, the random status q will be 0. The appropriate values of voltages $V_{r1}$ and $V_{r2}$ may be found in Table 1.

FIG. 9 illustrates the ideal case wherein the amplification rate is 2. In this case, since status q=1 and status q=0 cause a difference in the residue voltage, the output signal $A_{j+1}$, and hence the digital output code $D_o$ (FIG. 10), will also have a difference. For example, in an ideal case, the difference in output signal $A_{j+1}$ between status q=1 and q=0 is $\frac{1}{2}V_r$. However, if non-linear error occurs, the digital output code $D_o$ may not be able to correctly reflect such difference. The difference in digital output code $D_o$ may be calculated by averaging all digital outputs for status q=1 to obtain an output code $E[D_o]_{q=1}$, and averaging all digital outputs for status q=0 to obtain an output code $E[D_o]_{q=0}$. The difference $E[D_o]_{q=1} - E[D_o]_{q=0}$ is the difference in digital output code $D_o$, and is referred to as partial weight $W_2$, as shown in FIG. 9. The value of partial weight $W_2$ is used in the calibration, as will be discussed in subsequent paragraphs.

Figure 8:
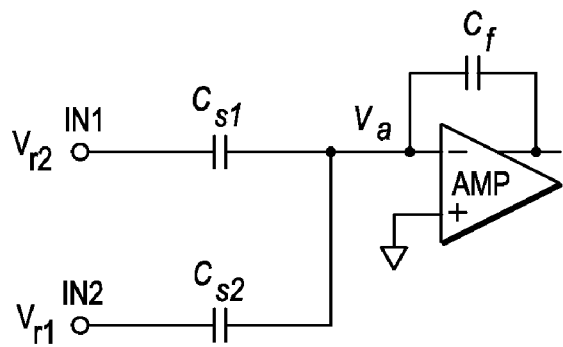

Next, as shown in FIG. 8, voltage $V_{r1}$ is applied to input node IN2, while voltage $V_{r2}$ is applied to input node IN1. Again, the values of voltages $V_{r1}$ and $V_{r2}$ may be determined using Table 1. Accordingly, through the same process as discussed in preceding paragraphs, another partial weight $W_1$ as shown in FIG. 9 is obtained. Again, partial weight $W_1$ is obtained by generating a random status q, and applying voltage $V_{r2}$ that corresponds to status q to input nodes IN1 and IN2. Weight W of stage j is thus calculated as $W=W_1+W_2$. For example, if stage j is the fourth stage counted from the LSB, with each stage generating one bit, then weight W of stage j is expected to be 8 in an ideal case. However, with errors, the actual weight W of stage j may deviate from the expected value, and the obtained actual weight W may be used to calibrate the ADC to obtain the correct digital codes. It is noted that the weight W is for a single stage j, and the same process is performed for each of the stages, so that for each of the stages, a respective weight W is obtained.

In an exemplary embodiment, assuming a certain number such as two thousand conversions are performed, one thousand conversions may be used to obtain partial weight $W_1$, and the other one thousand conversions may be used to obtain partial weight $W_2$. Among each of the one thousand conversions, about 500 conversions correspond to status q=1, and about 500 conversions correspond to status q=0. It is noted that these conversions are not only used for the calibration. The conversions also provide the actual analog-to-digital process for converting real analog signals. In other words, weight W is obtained without affecting the analog-to-digital conversion. The calculation of $(E[D_o]_{q=1}-E[D_o]_{q=0})$ may be performed by accumulating and averaging, wherein in the accumulation, whenever status q is 1, the respective digital output code $D_o$ is added to the previous accumulated value, and whenever status q is 0, the respective digital output code $D_o$ is subtracted from the previous accumulated value. The accumulated value may be divided by 500 to obtain weight W.

It is noted that in the above-discussed embodiment, with the increase in the number of conversions, weight W of each of the stages converges to the actual value, and for each of the conversions, the actual digital output of the ADC is calibrated using the obtained weight W. The calibration is thus a dynamic process.

FIG. 10 illustrates how an exemplary calibration is performed. Block ZADC represents a sub-ADC including all stages (including stages j+1 (not shown) through P) on the output side of stage j, wherein sub-ADC ZADC generates digital output code $D_o$, as discussed in preceding paragraphs. Wi extractor (with i being 0 or 1) is used to retrieve partial weights $W_1$ and $W_2$, so that weight W can be calculated. In an exemplary embodiment, the calibration is performed stage by stage (also refer to FIG. 5) from right to left, and the calibration result, which is referred to as calibrated output $D_o'$ (rather than the un-calibrated digital output code $D_o$), of ZADC is used to calibrate the preceding stage j. Therefore, the calibrated digital output code $D_{o\,j}'$ (not shown) from stages including stages j through p may be expressed as $D_{o\,j+1}'+W_j*D_j$, wherein $D_{o\,j+1}'$ is the calibrated digital output code of the ZADC including stages j+1 through P, $W_j$ is the weight of stage j, and $D_j$ is the digital code generated by stage j only. In an exemplary embodiment, referring to FIGS. 5 and 10, stage P, which is the stage corresponding to the least significant bit, is calibrated first. Next, stage P−1 (not shown, on the left of stage P) is calibrated using the calibrated digital output code $D_o'$ of the ZADC including stages P only. Next, stage P−2 is calibrated using the calibrated digital output code $D_o'$ of the ZADC including stages P and P−1. The process is continued until all stages of the ADC are calibrated.

Figure 11:
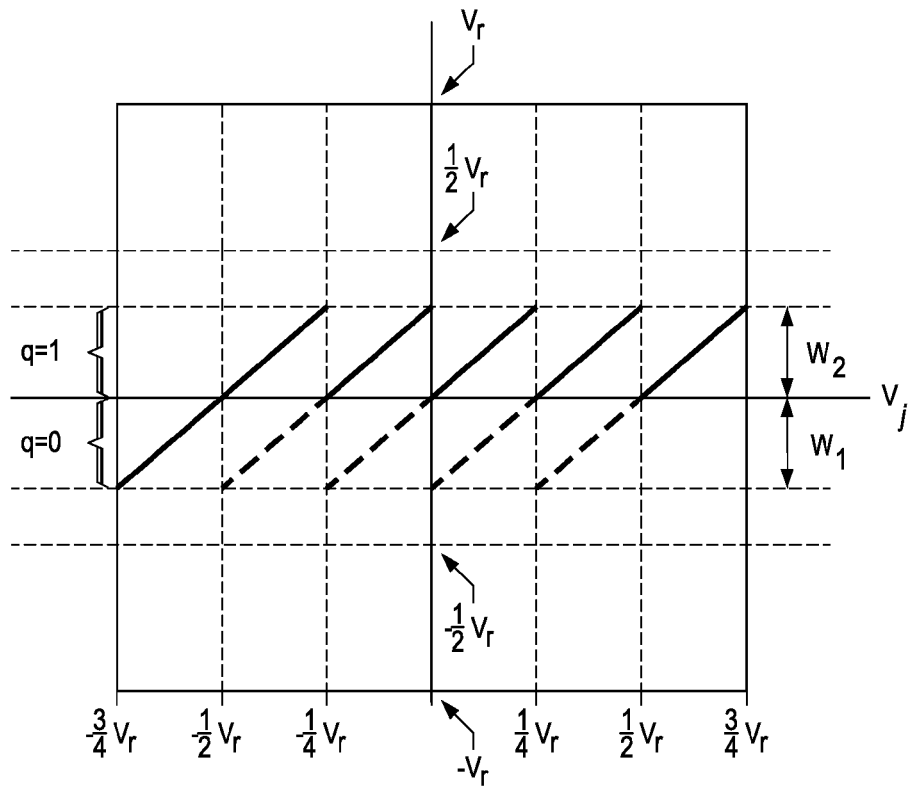
FIG. 11 illustrates the a non-ideal residue transfer curve.
Figure 12:
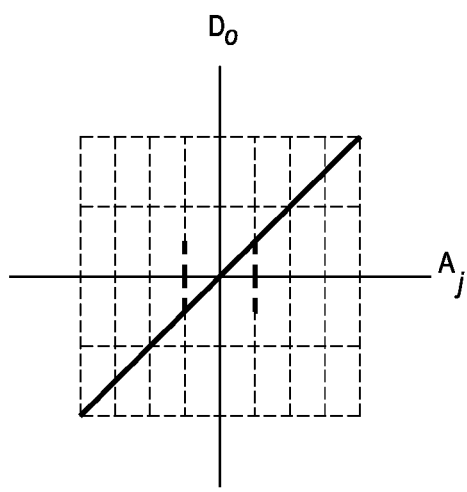
FIG. 12 illustrates the digital output code of a stage as a function of the input signal of the stage in accordance with an embodiment of the present invention, wherein the digital output code corresponds to the non-ideal residue transfer curve shown in FIG. 11.
Figure 13:
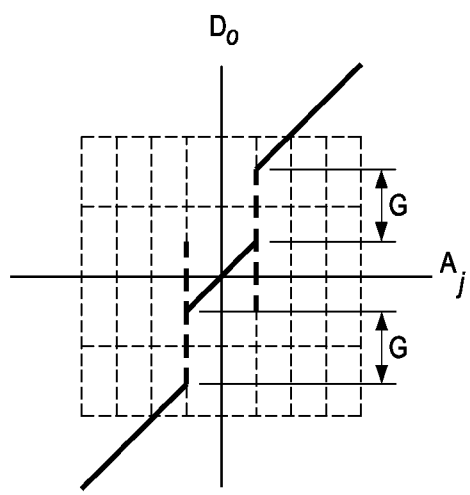
FIG. 13 illustrates a conventional digital output code of a stage as a function of the input signal of the stage, wherein the digital output code corresponds to the non-ideal residue transfer curve shown in FIG. 11.

As discussed in preceding paragraphs, FIG. 9 illustrates a residue transfer curve, in which no non-linear errors occur. It is observed that due to various reasons, such as sub-DAC (refer to FIG. 5b), errors and/or capacitor mismatch between capacitors $C_{s1}/C_{s2}$ and $C_f$ (FIG. 6), non-linear errors may occur. FIG. 11 illustrates the residue transfer curve of a stage of an ADC in an error case, wherein the amplifying rate of a corresponding stage deviates from the ideal value 2. However, by using the embodiments of the present invention, as shown in FIG. 12, the digital output code $D_o$ of the ADC is still linear to the input voltage, with no gap occurring. As a comparison, FIG. 13 illustrates a digital output code $D_o$ as a function of the input signal in a conventional ADC having non-linear errors.

The embodiments of the present invention have several advantageous features. The calibration is a continuous process that is performed without interrupting the operation of the ADC. No additional analog device is needed for performing the background calibration. Accordingly, the ADC circuit is simple. The embodiment of the present invention can be used to solve both linear errors and non-linear errors.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of operating an analog-to-digital converter (ADC), the method comprising:
    providing the ADC comprising:
        a plurality of stages, each comprising:
            an operational amplifier:
            a first capacitor comprising a first input end; and
            a second capacitor comprising a second input end, wherein each of the first capacitor and the second capacitor comprises an additional end connected to a same input of the operational amplifier;
    performing a plurality of signal conversions, wherein each of the plurality of signal conversions comprises:
        in an amplifying phase of one of the plurality of stages, applying a first voltage to the first input end of the one of the plurality of stages;
        in the amplifying phase, randomly selecting a second voltage from two different voltages; and
        applying the second voltage to the second input end of the one of the plurality of stages; and
    accumulating digital output codes of the one of the plurality of stages to generate an accumulated value, wherein the digital output codes are generated in the plurality of signal conversions.

2. The method of claim 1, wherein the step of performing the plurality of signal conversions further comprises:
    in an additional amplifying phase of the one of the plurality of stages, applying the first voltage to the second input end;

in the additional amplifying phase, randomly selecting a third voltage from two additional voltages; and
applying the third voltage to the first input end.

3. The method of claim 1 further comprising generating a weight of the one of the plurality of stages from the accumulated value.

4. The method of claim 3 further comprising calibrating a digital output of the ADC using the weight.

5. The method of claim 1 further comprising:
generating a weight for each of the plurality of stages; and
calibrating the plurality of stages stage-by-stage starting from a stage for generating a least significant bit, wherein each of the plurality of stages is calibrated using a calibrated digital output obtained from stages on an output side of each of the plurality of stages.

6. The method of claim 1, wherein the first capacitor has a same capacitance as the second capacitor.

7. The method of claim 1, wherein the two different voltages comprise a third voltage equal to the first voltage, and a fourth voltage different from the first voltage.

8. The method of claim 7, wherein the third voltage is a non-zero voltage, and the fourth voltage is zero volts.

9. The method of claim 1, wherein the step of accumulating the digital output codes comprises:
adding a digital output code of the one of the plurality of stages to an accumulated value when the second voltage equals a third voltage in the two different voltages; and
subtracting the digital output code of the one of the plurality of stages from the accumulated value when the second voltage equals a fourth voltage in the two different voltages.

10. The method of claim 1, wherein the first capacitor has a first capacitance equal to a second capacitance of the second capacitor.

11. A method of operating an analog-to-digital converter (ADC) comprising a plurality of stages, the method comprising:
providing the ADC comprising:
a plurality of stages, each comprising:
an operational amplifier:
a first capacitor comprising a first input end; and
a second capacitor comprising a second input end, wherein each of the first capacitor and the second capacitor comprises an additional end connected to a same input of the operational amplifier, and wherein the first capacitor and the second capacitor have a same capacitance;
performing a first plurality of signal conversions to obtain a first partial weight of one of the plurality of stages comprising:
in an amplifying phase of each of the first plurality of signal conversions, applying a first voltage to the first input end; and
in the amplifying phase, randomly selecting a second voltage from a third voltage and a fourth voltage, and applying the second voltage to the second input end;
accumulating digital output codes of the one of the plurality of stages to obtain an accumulated value, wherein the digital output codes are generated in the first plurality of signal conversions;
averaging the accumulated value to obtain the first partial weight; and
calibrating a digital output of the ADC using the partial weight.

12. The method of claim 11, wherein the second voltage is a function of an input voltage of the one of the plurality of stages.

13. The method of claim 11, wherein the ADC is a pipeline ADC.

14. The method of claim 11, wherein the step of accumulating the digital output codes comprises:
adding a digital output code of the one of the plurality of stages to an accumulated value when the second voltage equals the third voltage; and
subtracting the digital output code of the one of the plurality of stages from the accumulated value when the second voltage equals the fourth voltage.

15. The method of claim 11 further comprising:
performing a second plurality of signal conversions to obtain a second partial weight of the one of the plurality of stages comprising:
in an additional amplifying phase of each of the first plurality of signal conversions, applying a fifth voltage to the second input end; and
in the additional amplifying phase, randomly selecting a sixth voltage from a seventh voltage and a eighth voltage, and applying the sixth voltage to the first input end;
accumulating additional digital output codes of the one of the plurality of stages to obtain an additional accumulated value;
averaging the additional accumulated value to obtain the second partial weight; and
adding the first partial weight and the second partial weight to obtain a weight of the one of the plurality of stages.

16. The method of claim 15, wherein in each of the first plurality of signal conversions, a weight is generated for each of the plurality of stages, and wherein the method further comprises calibrating the plurality of stages stage-by-stage, with each of the stages being calibrated using a calibrated digital output obtained from all stages on an output side of the each of the plurality of stages.

17. The method of claim 11, wherein the first capacitor has a first capacitance equal to a second capacitance of the second capacitor.

* * * * *